United States Patent [19]
Luttmer, Willem

[11] 3,947,957
[45] Apr. 6, 1976

[54] MOUNTING INTEGRATED CIRCUIT ELEMENTS

[75] Inventor: Luttmer, Willem, Romiley, England

[73] Assignee: International Computers Limited, London, England

[22] Filed: Mar. 12, 1974

[21] Appl. No.: 450,323

[30] Foreign Application Priority Data
Mar. 24, 1973 United Kingdom............... 14287/73

[52] U.S. Cl. ...................... 29/626; 29/577; 29/589; 29/625; 156/3; 357/71; 357/74
[51] Int. Cl.² ...................... H05K 3/30; H05K 3/32
[58] Field of Search ............ 29/577, 589, 591, 625, 29/626; 174/68.5; 317/101 A, 101 B, 101 C, 101 CC, 101 CM; 96/36.2, 38.4; 156/3, 6, 8, 11; 204/15, 32 R, 32 S; 117/200, 212, 213, 217, 218

[56] References Cited
UNITED STATES PATENTS

| | | | |
|---|---|---|---|
| 3,366,519 | 1/1968 | Pritchard et al. ...................... | 156/3 |
| 3,525,617 | 8/1970 | Bingham ............................... | 156/3 X |
| 3,540,954 | 11/1970 | Pritchard et al. ...................... | 156/3 |
| 3,622,384 | 11/1971 | Davey et al. ............. | 317/101 A UX |
| 3,679,941 | 7/1972 | Lacombe et al. ............... | 317/101 A |
| 3,691,628 | 9/1972 | Kim et al. ........................ | 29/626 X |
| 3,726,002 | 4/1973 | Greenstein et al................... | 29/577 |
| 3,846,166 | 11/1974 | Saiki et al............................ | 29/625 |

OTHER PUBLICATIONS
The Electronic Engineer, "ISSCC–Consumer Products Got a Piece of the Action," Socolovsky, Weniger, Edelman, Apr. 1968, pp. 92–96.

*Primary Examiner*—C. W. Lanham
*Assistant Examiner*—Joseph A. Walkowski
*Attorney, Agent, or Firm*—George R. Douglas, Jr.; Anthony D. Cennamo

[57] ABSTRACT

A multi layer printed circuit interconnection system together with pillars for mounting integrated circuit components is progressively formed layer by layer by successive sequences for each layer, involving using a photo resist to produce a pattern of apertures defining circuit tracks and the pillar positions, depositing metal to form the tracks and the pillars and replacing the remainder of the resist with insulation material. Openings co-operating with the pillars, for the circuit elements are produced during formation of the outermost insulation layer of the circuit system.

The circuit elements are mounted on the pillars and the connections between the elements and the printed circuit system are formed by using a further one of said sequences.

4 Claims, 11 Drawing Figures

MOUNTING INTEGRATED CIRCUIT ELEMENTS

BACKGROUND OF INVENTION. INVENTION

This invention relates to the mounting and connection of integrated circuit elements.

It is common practice for the manufacturers of integrated circuit elements or chips to provide to the user an encapsulated unit of a standard size with a standard pin spacing. The unit may thus be connected simply into a suitable printed circuit. Such an encapsulated unit may contain one, or several interconnected, chips and may provide a single function such as a shift register or adder, or multiple functions such as several independent amplifiers.

The operating speed of the circuits which may be made on chips is so high that the time delay due to the propogation of electrical signals along even 2 or 3 cms. of wire is comparable with the time delay of a logic gate or the switching time of a flip-flop. Since the encapsulated circuit involved wire lengths of this order, thought has been given to other methods of construction which permit much higher densities of chips and interconnecting wiring, thus reducing the average length of the signal wiring. A further problem which is likely to arise with an increase in chip density is the need to provide for the rapid dissipation of the heat which is generated by the chips when in operation.

A solution to these problems is described in U.S. Pat. No. 3390308. A number of chips are accommodated in depressions in a substrate which may be of anodised aluminium or other good heat conducting material. A dielectric sheet is formed with windows corresponding to the positions of the chips and with conductive beam leads which project into the window area. The sheet is placed over the substrate and the beam leads are welded to the contact pads on the chips. It will be appreciated that some number of interconnections may be provided on the dielectric sheet, but that, if this number is insufficient, further sheets will have to be provided on top of the first sheet to form a multi-layer printed circuit of conventional form. The result of this is that the chips are now buried beneath the printed circuit and replacement of a faulty chip is virtually impossible.

Furthermore, whilst the task of welding a beam lead to a contact pad is not unduly difficult with present techniques, but the welding of many such connections whilst maintaining mechanical and electrical integrity is time consuming and costly.

SUMMARIES OF THE INVENTION

According to one aspect of the invention a process for mounting and connecting a plurality of integrated circuit elements includes the steps of: forming on a substrate a multi-layer printed circuit interconnection system having inter layer connections, circuit connection regions for connection to the pads, and a plurality of spaced apart circuit element mounting pillars extending from the substrate to at least the outermost of said layers; forming an insulating layer on said outermost circuit layer, the insulating layer having a thickness substantially equal to that of the circuit elements and openings corresponding to the mounting pillars and to the circuit connection regions of the circuit connection system; mounting the circuit elements on the pillars such that the connection contact pads of the circuit elements are exposed and forming thereafter connections between the pads and the circuit connection regions so as electrically to connect the circuit elements to the circuit connection system.

According to another aspect of the invention an electrical assemblage includes a substrate; a multi-layer printed circuit system mounted on the substrate; a plurality of windows or cavities in the outer layer of the system, each said window exposing the top of a mounting pillar for mounting a circuit element to be coupled to the circuit system; each said pillar extending through the circuit system to the substrate; integrated circuit elements mounted on top of at least some of the pillars, with the contact pads of the circuit elements exposed; and electrical conductors formed on the outer layer of the system and joined to the contact pads.

BRIEF DESCRIPTION OF THE DRAWINGS

The invention will now be described by way of example with reference to the accompanying drawings, in which.

Figure 1A:
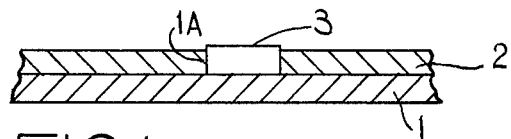
FIGS. 1a to 1f illustrate successive stages in the formation of a multi-layer interconnection system: the figure showing only a fragmentary portion of the complete system.

A base or substrate for carrying an assemblage of integrated circuit elements, or chips, may be a copper plate or block 1 (FIG. 1a). A block which is 75mm. × 3mm. thick may be used to accommodate 25 to 50 chips with a total power disipation of up to 100 watts.

A layer 2 of masking material is then applied to the surface of the block 1. A preferred working material is a suitable electrically non-conductive developable photosensitive material such as a photopolymer in a flowable or sheet form. Conveniently a sheet form is used. In the following specification this masking material is termed a photo-resist material. Thus a layer of photo resist material 2 is applied to the surface of the substrate block 1. The photo-resist material may be, for example, a sheet of 'Riston' (Registered Trade Mark), made by E. I. du Pont de Nemours and Company. The sheet may be about 100 microns in thickness.

The photo resist is exposed and developed in the conventional manner to produce as many square apertures 1A in the resist as there are chips to be mounted. Each aperture is the same size as a chip, say, 2mm. × 2mm.

A copper pillar 3 is formed in each aperture by electrolytic deposition. For convenience only a single pillar is illustrated. The pillar fills the aperture and extends slightly above it. The top surface is now rubbed lightly with fine abrasive to make all the pillars 3 the same height as the layer 2, say 100 microns, and flat topped. It will be clear that the thickness of the layer 2 would be selected according to the initial height required for the pillars 3. The remainder of the photo-resist is then removed with a suitable solvent to leave an array of pillars 3 extending 100 microns above the surface of the copper substrate or block 1.

The space previously occupied by the photo-resist layer 2 must be filled with a uniform layer of an insulating material which has the desired properties in respect of thickness, dielectric constant, mechanical strength, coefficient of expansion, etc.

The achievement of this layer is a difficult problem, particularly when the dimensions are as small as in the present example. It has been found that very satisfactory results can be obtained by utilising an insulating material which can be prepared to give a dough-like consistency for application preferably under heat and pressure. One material which has been found to be suitable is a mixture of one part of epoxy resin AV100, one part of hardener HV100 and two parts of magnesium silicate with a particle size not exceeding 10 microns. The resin and hardener are supplied by Ciba Limited.

Figure 3:
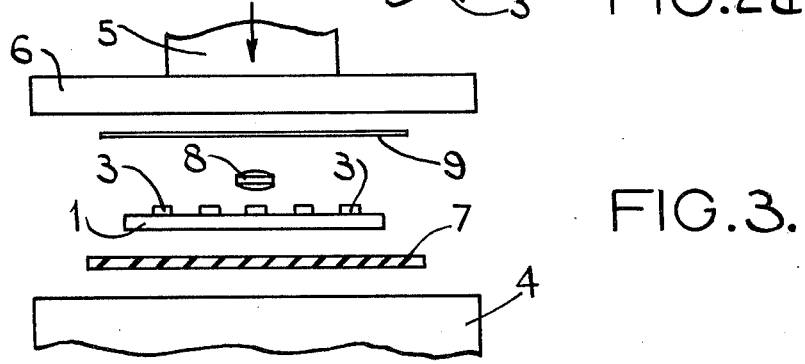

The insulating material is applied as indicated schematically in FIG. 3. Block 4 is the base of a press with a ram which is capable of exerting a substantial force of the order of 30 Kgf/cm.$^2$ or more. Pressure plate 6 of the ram is heated to about 80°C – 120°C, for example, by an electrical heating element. A thin hard elastomeric sheet 7, made, for example, of Viton, is placed on the block 4 and the substrate plate or block 1 with the pillar 3 is placed on the sheet. A pellet 8 of the epoxy dough is placed in the centre of the substrate and a release sheet 9, for example a thin film of triacetate, which prevents adherence of epoxy to the pressure plate, is placed above the block 1 and pellet 8 and beneath the pressure plate 6. The various items are shown spaced apart in FIG. 3. for the sake of clarity.

The size of the pellet 8 is chosen by trial and error so that there is sufficient material to form a uniform layer of the desired thickness with little excess. In the present example, the pellet had a volume of approximately 1 cc.. When the ram 5 is lowered the material in the pellet 8 is forced to flow over the surface of the substrate. However, the compression of the insulating material is limited by the pillars 3, so that the final layer is uniform and of a thickness which is determined by the height of the pillars 3. The high viscosity of the material, together with the heat and the high pressure ensure that the layer is free of voids. The sheet 7 has sufficient elasticity to accommodate any small errors in the flatness and parallelism of the plate 6, the block 4 and the substrate 1, so that the pressure is applied uniformly across the substrate.

The press is opened after approximately 10 minutes and the substrate is placed in an oven to complete the curing of the resin. When curing has been completed, the substrate is removed and the upper surface is rubbed lightly with abrasive to ensure that the tops of the pillars 2 are free of all resin.

Figure 1B:
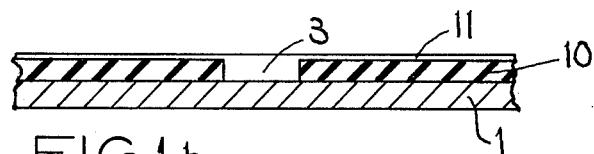

The entire upper surface of the assembly i.e., the copper pillars and insulating material is plated with copper using an electroless process for 3 to 5 minutes and a further copper layer is deposited electrolytically on the electroless layer to provide the starting point for further plating operations. The assembly is now as shown in FIG. 1b. Each pillar is surrounded by resin insulation 10 on which has been plated copper layer 11, the latter being very thin, for example, 1 to 2 microns. It will be understood that the dimensions of the various parts are such that they cannot conveniently be shown in the correct scale relationships in the drawings.

Figure 1C:
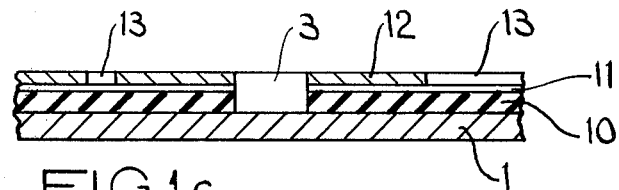

Preparation of the next layer starts with the application of a photo-resist layer 12 (FIG. 1c) to the to the copper layer 11. This layer 12 is exposed and developed in accordance with a pattern of conductor tracks, for example, together with the pattern of pillars. The assembly is now plated up as in the original formation of the pillars, except that the thickness of the resist layer and of the plating is of any required thickness from 25 to 100 microns, for example 25 – 30 microns. This plating produces tracks 13 and also increases the height of the pillar 3, the tracks having a width of say 100 microns. It will be understood that the pillar now consists of the originally deposited pillar, a portion of the copper layer 11 and the top portion deposited through the layer 13. However, it is considered that it is clearer to show the pillar as though it were a single piece of copper, which it is electrically and mechanically.

Figure 1D:
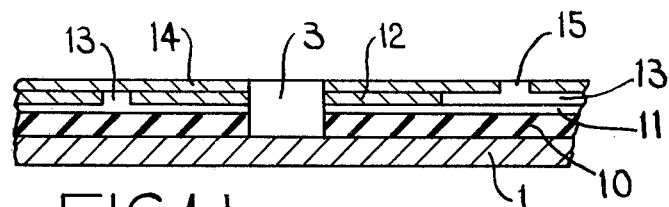

A second resist layer 14 (FIG. 1d) of, say, 75 – 80 microns is applied to the resist layer 12 and is exposed and developed for the pattern of pillars and a pattern of risers 15, that is small pillars of about 100 microns diameter which provide connections between tracks is different layers. A further plating operation adds to the height of the pillar 3 and produces for example, one of the risers 15 on one of the tracks.

The resist layers 12 and 14 are now removed to expose the pillars 3, the tracks 13 and risers 15 and the copper layer 11. The assembly is now etched to remove the layer 11 except where it has been incorporated in the tracks, etc. The etch will also attack the tracks, etc., which are exposed, but since the layer 11 is thin compared with the desired circuit for pillars and tracks, no appreciable effect is produced on the thickness of the tracks and pillars.

Figure 1E:
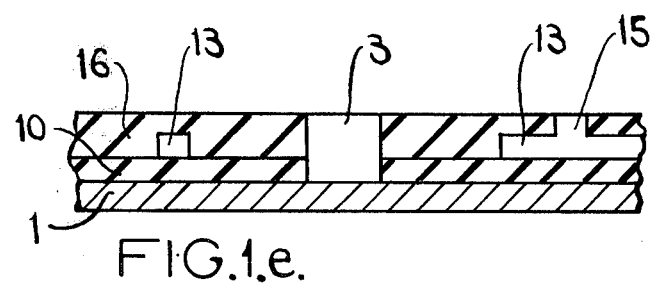

The assembly is cleaned after the etch, the tops of the pillars 3 and risers 15 are abraded as before, and a further insulating layer 16 is laid to encapsulate the tracks, pillars and risers, in the manner described above. This produces an assembly as shown in FIG. 1e.

Figure 1F:
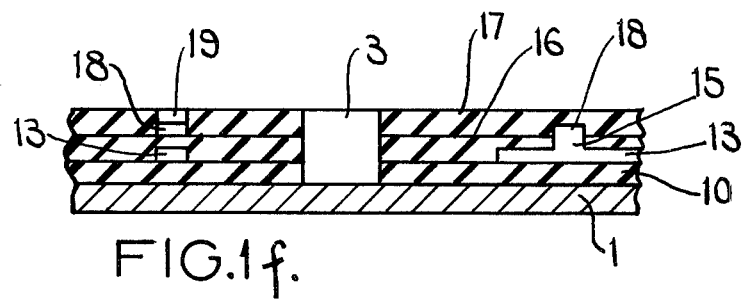

It will be understood that the sequence of steps may be repeated several times to produce further layers of tracks, with or without risers, the pillars 3 being built up at the same time. One or more of the copper layers may be left entire over a part, or the whole, of the area of the substrate to provide a uniform potential surface such as a ground plane. The form of the assembly after another layer has been completed is shown in FIG. 1f. As will be seen in FIG. 1f the tracks 13 and the riser 15 have been encapsulated in an insulating layer 16. Tracks 18 with a riser 19 have been formed on the layer 16 and have then been encapsulated in an insulating layer 17 such that the top of the riser 19 is level with the top of the layer 17. The pillar 3 has been built up with each layer so that its top is level with the top surface of the layer 17.

The various tracks and the risers as shown in the FIG. 1f are produced by two successive groups of steps involving laying down a resist layer, exposing, developing and plating up. This is a desirable way of carrying out the process because it minimises the number of process steps, but it may lead to difficulties. It is possible, for example, that the application of the second resist layer 14 may cause partial detachment of the first resist layer 12. If such difficulties are experienced, the full sequence of steps may be carried out each time, that is, after the track has been deposited, the associated resist layer and the temporary plating layer 11 are removed, a resin layer is put down and cured, and a temporary plating layer is put down on the resin layer. The whole sequence of steps is then repeated to produce the risers and continue the build up of the pillars.

Figure 2A:
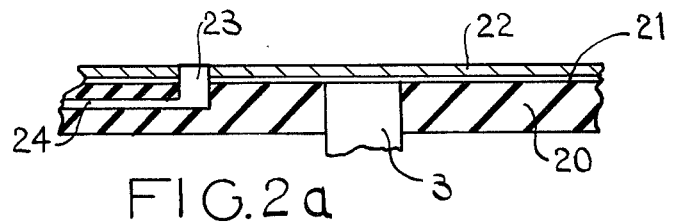
FIGS. 2a to 2d show successive stages in the mounting of an integrated circuit element on to the interconnection system of the FIGS. 1a – 1f and FIG. 3 shows in schematic form apparatus for forming an insulating layer used in the formation of the system of FIGS. 1 and 2.

When the desired multi-layer interconnection assembly has been built up in the manner described above, the top surface of the assembly is prepared to receive the chips. Part of such a top layer is shown in FIG. 2a. As in the formation of previous layers, a temporary copper layer 21 is put down on insulating layer 20. For convenience, the arrangement of pillars and tracks beneath the layer 20 are not illustrated. A photo resist layer 22 with a thickness substantially equal to that of a chip is applied to the layer 21. The resist layer 22 is exposed and developed in accordance with the pattern of risers which is required to connect the chips to the top layer of tracks 24. Risers 23 are plated up in the manner already described.

Figure 2B:
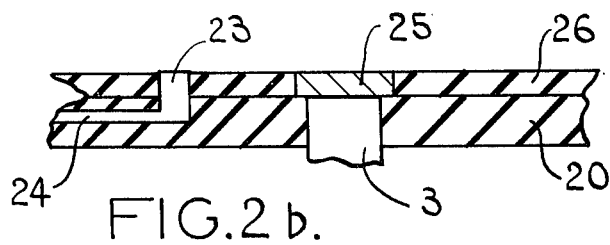

The resist layer 22 is removed and a further layer of resist is applied and is exposed and developed in accordance with the reverse of the pillar pattern. This leaves a covering 25 of photo-resist material (FIG. 2b) on top of each of the pillars 3. The resist layer on each pillar prevents the pillars 3 from being plated during the increasing of the height of the risers to a level co-incident with the top of the resist layer 25. An insulating layer 26 is applied in the manner previously described (FIG. 2b).

When the layer 26 has been cured, the resist 25 is removed to leave cavities, which are slightly larger than a chip, above each pillar 3.

Figure 2C:
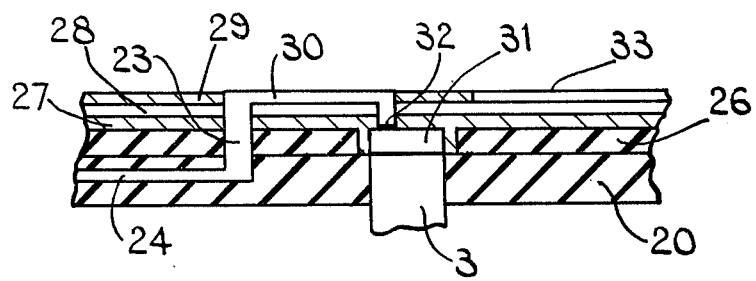

A chip 31 (FIG. 2c) is bonded to the top of each pillar 3. A very thin layer 27 of resist, approximately 2 microns thick, is applied to the top of the assembly and is exposed and developed with the pattern of the risers 23 and chip contact pads 32. The resist is now covered with a layer 28 of copper by electroless deposition. This layer 28 is very thin, for example, 2 microns thick.

Figure 2D:
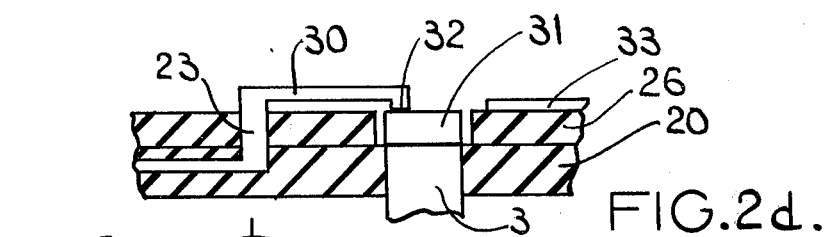

A further layer 29 of resist is applied to the layer 28 and is exposed and developed in accordance with the required pattern of links 30 between the risers 23 and the chip pads and tracks 33, which provide connections between chips and/or to conductive finger areas around the edge of the assembly for external connections. These links 30 and tracks 33 have a thickness between 25 to 100 microns. Since this layer is exposed to the atmosphere, the links 30 and the tracks 33 are plated up in gold rather than copper. Finally, the resist layers 27 and 29 are cleaned off and the copper layer 28 is etched off to leave the structure shown in FIG. 2d.

It will be understood that the processes described above have produced a multi-layer interconnection assembly for a large number of chips in which the chips are provided with individual thermal connections through the pillars 3 to the common heat sink. The chips are readily accessible on the outer face of the assembly and the connections to them are formed in a single plating operation.

The method which has been described has been found to provide very satisfactory results, but those skilled in the art of printed circuits and integrated circuit manufacture will appreciate that the processes and the materials may be varied without departing from the spirit of the invention. For example, a variety of photo resist materials are available. Further, the substrate is intended to handle a large power dissipation. If the dissipation is lowered by using lower power chips or by using fewer chips in a given area a smaller mass of metal will be adequate and the solid copper block may be replaced by a glass fibre copper laminate, for example.

It will be understood that the press operation described above is not restricted to use in the particular application to the incapsulation of conductors since the press operation may be used to produce a single layer of insulation for example for test purposes, or to provide an accurately controlled impedence for strip line elements which are deposited on each side of the layer. Furthermore, the loading material and/or the resin may be conductive rather than insulating so that the layer may be used for example, to form thin film or thick film resistors.

It will be appreciated that the pressure exerted by the ram and the temperature of the plate 6 will depend upon the particular liquid base and solid additives which are employed. For example, if a nitrilephenolic resin is used as an alternative to the above mentioned epoxy resin.

Other resins are suitable as a liquid base provided that they form a good bond with the metals which may be used as circuit tracks or risers in the circuit interconnection. The solid additive may be any good insulator which is stable, provided good mechanical strength as can be prepared with appropriate particle size. Other glass-like materials are suitable as is silica. The maximum particle size is not critical but is preferable in the range 0.5 to 0.05 of the thickness of the layer.

I claim:

1. A process for mounting and interconnecting a plurality of integrated circuit chips with a multi-layer circuit system, comprising the steps of:
    a. providing a thermally conductive substrate;
    b. forming at desired positions on the substrate a plurality of chip support pillars having a first height;
    c. forming a first insulation layer on the substrate, the insulation layer extending up to the level of the chip support pillars leaving the tops of the pillars exposed;
    d. providing a circuit layer on the insulation and simultaneously increasing the height of the chip support pillars by the thickness of the circuit layer;
    e. providing at desired positions on the circuit layer inter-connection pillars which are to be electrically connected to a subsequently applied circuit layer and simultaneously building the chip support pillars up to the height of the inter-connection pillars;
    f. providing insulation up to the level of the inter-connection and support pillars leaving the tops of both forms of pillar exposed.
    g. repeating stages (d), (e) and (f) until level of penultimate circuit conductor layer is reached; and then
    h. forming a final circuit layer and simultaneously building up support and any interconnection pillars to the level of the final circuit layer;
    i. providing inter connection pillars at those locations of the final circuit layer it is required to connect to the chips;
    j. providing a final insulation layer to encapsulate the final circuit layer leaving the tops of any interconnection pillars exposed and forming a recess in the insulation layer at each said component pillar of such size that a clearance is provided around the periphery of a chip when mounted on the associated support pillar;
    k. mounting the chips on the support pillars in such manner as to produce good thermal contact with the associated support pillar and leaving the circuit interconnection regions of the chips exposed; and
    l. providing circuit interconnections between the chip connection regions and the interconnection pillars.

2. A process as claimed in claim 1; and including the step of increasing the height of the interconnection pillars of final circuit layer and providing risers on the chip connection regions, whereby any variations in chip thicknesses are accommodated.

3. A process as claimed in claim 1, and including the step of connecting the chip circuit connection regions to the interconnection pillars in a single operation.

4. A process as claimed in claim 1, in which connections between non-adjacent circuit layers are produced by progressively increasing the length of each interconnection pillar that is to provide such interconnections during formation of circuit layers which are not to be interconnected until each such interconnection pillar reaches the plane of the outermost circuit layer of said non-adjacent circuit layers.

* * * * *